United States Patent
Krefft et al.

(10) Patent No.: US 10,438,901 B1
(45) Date of Patent: Oct. 8, 2019

(54) INTEGRATED CIRCUIT PACKAGE COMPRISING AN ENHANCED ELECTROMAGNETIC SHIELD

(71) Applicant: QUALCOMM Incorporated, San Diego, CA (US)

(72) Inventors: Anna Katharina Krefft, Munich (DE); Claus Reitlinger, Munich (DE)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/106,117

(22) Filed: Aug. 21, 2018

(51) Int. Cl.
  *H01L 23/552* (2006.01)
  *H01L 21/56* (2006.01)
  *H01L 21/48* (2006.01)
  *H01L 23/08* (2006.01)

(52) U.S. Cl.
  CPC ........ *H01L 23/552* (2013.01); *H01L 21/4817* (2013.01); *H01L 21/56* (2013.01); *H01L 23/08* (2013.01)

(58) Field of Classification Search
  CPC ........... H01L 23/552; H01L 2924/3025; H01L 2224/32245; H01L 25/5225; H01L 25/0753
  USPC .................................................. 257/659, 704
  See application file for complete search history.

(56) References Cited

U.S. PATENT DOCUMENTS

| | | | | |
|---|---|---|---|---|
| 7,692,292 | B2* | 4/2010 | Higashi | H01L 23/04 257/704 |
| 9,386,734 | B2 | 7/2016 | Reitlinger et al. | |
| 2011/0221046 | A1* | 9/2011 | Xiao | H01L 23/3135 257/659 |
| 2013/0214396 | A1 | 8/2013 | Kim | |
| 2014/0151859 | A1* | 6/2014 | Kim | H01L 23/552 257/659 |
| 2014/0225236 | A1* | 8/2014 | Kim | H01L 24/97 257/659 |
| 2014/0319661 | A1* | 10/2014 | Pagaila | H01L 23/147 257/659 |
| 2016/0027740 | A1* | 1/2016 | Chiu | H01L 21/4853 257/659 |

FOREIGN PATENT DOCUMENTS

| | | |
|---|---|---|
| CN | 102892279 A | 1/2013 |
| CN | 104039121 A | 9/2014 |
| CN | 107230664 A | 10/2017 |
| CN | 108133912 A | 6/2018 |

* cited by examiner

*Primary Examiner* — S. V. Clark
(74) *Attorney, Agent, or Firm* — Qualcomm Incorporated

(57) ABSTRACT

Some features pertain to a package that includes an enhanced electromagnetic shield. The package includes a substrate, an electronic component coupled to the substrate, and a mold partially surrounding the electronic component. The package further includes a first shield over the mold, and a second shield over the first shield. One of the first shield or the second shield is a high permeability shield and the remaining first or second shield is a high conductivity shield relative to the high permeability shield.

16 Claims, 7 Drawing Sheets

INTEGRATED CIRCUIT PACKAGE COMPRISING AN ENHANCED ELECTROMAGNETIC SHIELD

BACKGROUND

Field of the Disclosure

Various features relate to an enhanced electromagnetic shield for an integrated circuit package.

Background

Integrated circuits, integrated circuit packages and electronic devices are being continually driven to smaller form factors. Smaller form factors are needed so that such devices may be integrated into mobile devices such as mobile phones, tablets, laptops, etc. Integrated circuit packages include several components such as a substrate, and electronic devices including die, integrated circuits, and passive devices. These electronic devices including die, integrated circuits, and passive devices, require electromagnetic shielding. An electromagnetic shield protects the electronic devices from radio frequencies, electromagnetic fields and electrostatic fields. Likewise, the electromagnetic shield protects electronic devices outside of the electromagnetic shield, from radio frequencies, electromagnetic fields and electrostatic fields generated by the electronic devices on the integrated circuit package. A challenge exists in achieving a small form factor electromagnetic shield with improved shielding effectiveness.

Figure 1:
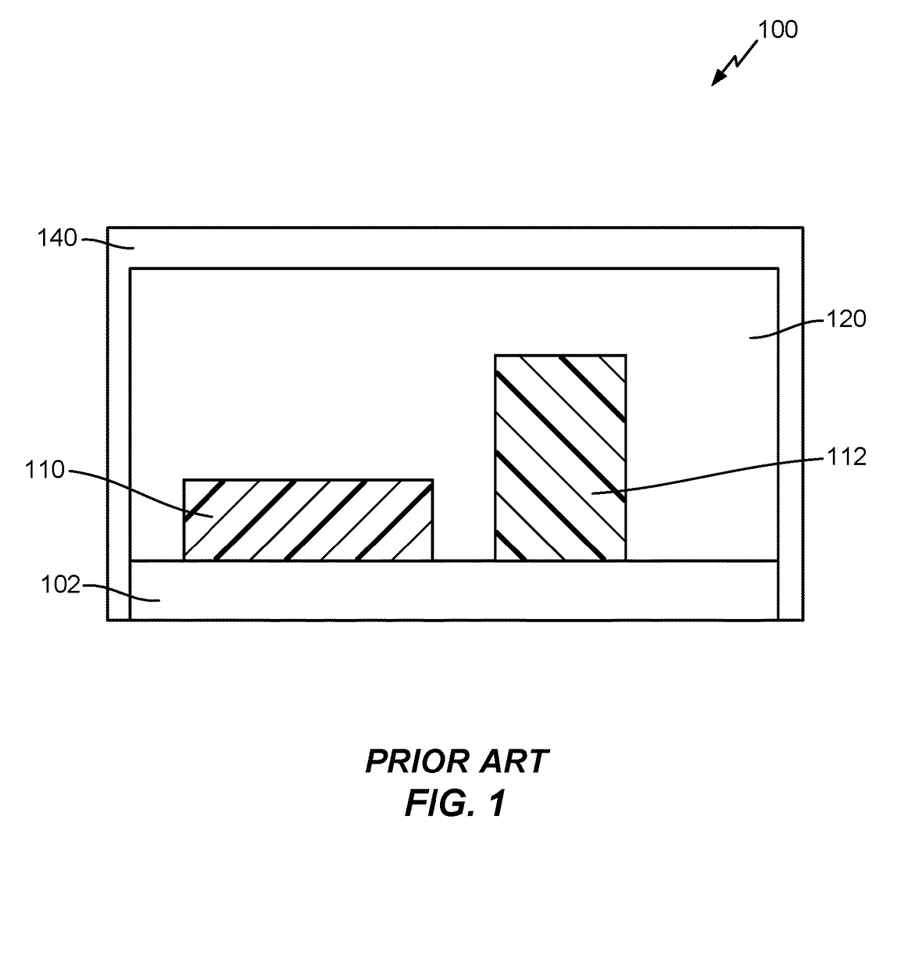
FIG. 1 illustrates a package including a conventional shield.

FIG. 1 illustrates a package including a conventional shield. Specifically, FIG. 1 illustrates an integrated circuit (IC) package 100, the IC package 100 including a substrate 102, electronic components 110 and 112 (e.g., a die, or passive components), a mold 120, and a shield 140. The shield 140 is sputtered onto the mold 120. The shield 140 is sputtered so that the thickness of the shield can be kept smaller. However, one drawback is the sputtering process may result in a reduced shielding effectiveness. Another drawback is that where use of a high permeability material is desired (e.g., as the first shield), it may be difficult to achieve a thin layer.

Accordingly, there is an industry need for increased shielding effectiveness, while maintaining a small form factor. In other words, there is an industry need for an electromagnetic shield with increased shielding effectiveness, that does not significantly increase the height of the IC package 100.

SUMMARY

Various features relate to an enhanced electromagnetic shield for an integrated circuit package.

A first example provides a package, including a substrate, an electronic component coupled to the substrate, and a mold partially surrounding the electronic component and coupled to the substrate. The package further includes a first shield located over the mold, and a second shield located over the first shield. One of the first shield or the second shield is a high permeability shield and the remaining first or second shield is a high conductivity shield relative to the high permeability shield.

A second example provides a method of fabricating an integrated circuit package, including coupling an electronic component to a substrate, applying a mold to the electronic component and to the substrate, the mold partially surrounding the electronic component and the substrate. The method of fabricating an integrated circuit package further includes coupling a first shield over the mold and coupling a second shield over the first shield. One of the first shield or the second shield is a high permeability shield and the remaining first or second shield is a high conductivity shield relative to the high permeability shield.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams to avoid obscuring the aspects in unnecessary detail. In other instances, well-known circuits, structures and techniques may not be shown in detail in order not to obscure the aspects of the disclosure.

Overview

Some features pertain to a package that includes an electronic component coupled to a substrate including an enhanced electromagnetic shield. A mold partially surrounds the electronic component and is coupled to the substrate. A first shield is located over the mold, and a second shield is located over the first shield. One of the first shield or the second shield is a high permeability shield and the remaining first or second shield is a high conductivity shield relative to the high permeability shield. The first shield and the second shield are electromagnetic shields, configured to reduce electromagnetic interference to the electronic components within the package, and to electronic components outside of the package.

The mold includes mold sidewalls, the first shield includes first shield sidewalls, and the substrate includes substrate sidewalls. The first shield is located over the mold including over the mold sidewalls, and the substrate sidewalls. The second shield is located over the first shield, including over the first shield sidewalls.

In a first aspect, the package includes the first shield and second shield as described above. In a second aspect, the package includes a third shield located over the second shield including over second shield sidewalls. In a third aspect, the package includes a fourth shield located over the third shield including over third shield sidewalls. In a fourth aspect, the package may include more than four shields, comprising alternating first shield and second shield layers.

In any of the above aspects (i.e., first through fourth aspect), the first shield may be a high permeability shield. That is, the first shield is made of a material selected to have a high permeability. A high permeability material is a material that has a permeability larger than 10 H/m. The first shield may have a higher permeability relative to the second shield. If the first shield is a high permeability shield, then the second shield is a high conductivity shield. That is, the material of the second shield may be made of a high conductivity metal. Conductivity refers to the amount, level, or extent to which a specified material conducts electricity. The more a material can conduct electricity, the higher its conductivity. The second shield is a high conductivity shield relative to the first shield. In one aspect, the second shield is ten times more conductive than the first shield. In another aspect, the second shield is a high conductivity shield, because it has a conductivity greater than 1×106 S/m. The third shield is optional and is a high permeability shield. The fourth shield is optional and is a high conductivity shield.

Alternatively, in any of the above aspects (i.e., first through fourth aspect), the first shield may be a high conductivity shield and the second shield may be a high permeability shield. The optional third shield is a high conductivity shield, and the optional fourth shield is a high permeability shield.

Integrated Circuit Package Comprising an Enhanced Electromagnetic Shield

Figure 2:
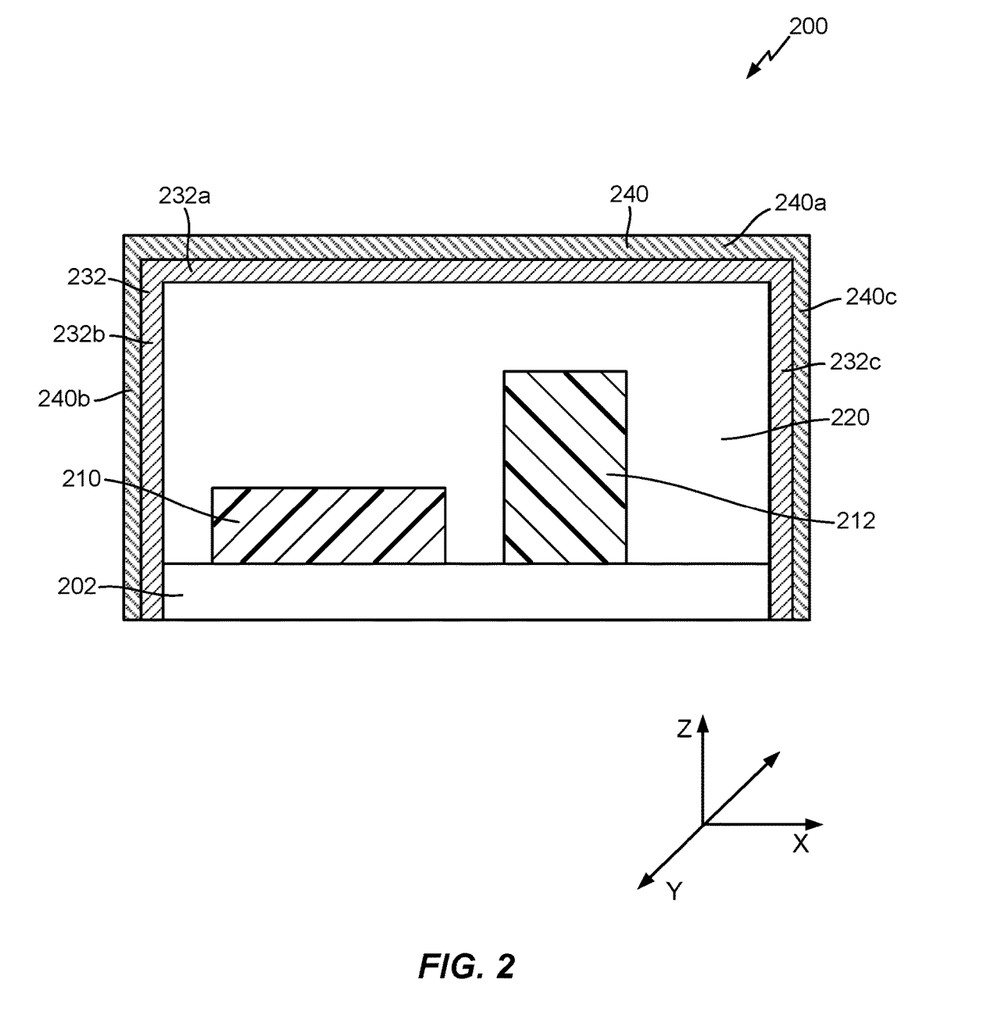
FIG. 2 illustrates a side view of an integrated circuit package including an enhanced electromagnetic shield.

FIG. 2 illustrates a side view of an integrated circuit package including an enhanced electromagnetic shield. Specifically, FIG. 2 illustrates an integrated circuit (IC) package 200. The IC package 200 includes a substrate 202, electronic components 210 and 212, a mold 220, a first shield 232, and a second shield 240. The first shield is a high conductivity shield 232, and the second shield 240 is a high permeability shield. It shall be understood that FIG. 2 is a simplified drawing of the IC package 200. The IC package 200 may include additional elements not shown such as dielectric layers, passivation layers, metal layers, and electronic components embedded in the substrate 202 or in a silicon substrate of one of the electronic components 210.

The substrate 202 may be a package substrate. Alternatively, at least one of the electronic components 210 or 212 and the substrate 202 together may comprise a wafer level package. The substrate 202 includes substrate sidewalls. The substrate 202 may be coupled to ground.

The electronic component 210 may be an IC, a die, a passive device or any other type of electronic component. The electronic component 212 may be an IC, a die, a passive device or any other type of electronic component. The IC package 200 may only have a single electronic component (e.g., one of 210 or 212) or may have many electronic components.

The mold 220 partially surrounds the electronic components 210 and/or 212 and is coupled to the substrate 202. The mold 220 has a top side, and a first mold sidewall, a second mold sidewall, a third mold sidewall, and a fourth mold sidewall (i.e., collectively mold sidewalls). The mold 220 may include one or more of the following materials: Epoxy resin with fused silica filler or any other organic filler material, but is not so limited. For example, the mold 220 may be any material that can be deposited, formed or molded over the electronic components 210 and/or 212 and that provides mechanical support, and environmental protection for the IC package 200 and the electronic components 210 and/or 212.

The first shield 232 is located over the mold 220, and in one aspect, may be coupled directly to the mold 220. The first shield 232 has a first shield top side 232a, and a first first shield sidewall 232b, a second first shield sidewall 232c, a third first shield sidewall (not shown in this view), and a fourth first shield sidewall (not shown in this view) (i.e., collectively first shield sidewalls). In one aspect, the first shield 232 is located over the top side of the mold 360 and over the mold 360 sidewalls. In another aspect, the first shield 232 is located directly on the top side of the mold 360, and directly on the mold 360 sidewalls. In either of the above-mentioned aspects, the first shield 232 is over the substrate sidewalls.

The first shield 232 is a high conductivity shield. The material of the first shield 232 may be made of a high conductivity metal. Conductivity refers to the amount, level, or extent to which a specified material conducts electricity. The more a material can conduct electricity, the higher its conductivity. The first shield 232 is a high conductivity shield relative to the second shield 240. In other words, the first shield 232 has a higher conductivity than the second shield 240. In one aspect, the first shield 232 is ten times more conductive than the second shield 240, In another aspect, the first shield 232 is a high conductivity shield, because it has a conductivity greater than 1×106 S/m.

The first shield 232 includes at least one of the following materials: copper (Cu), silver (Ag), gold (Au), aluminum (Al), or an alloy of any one of said materials, or any combination of said materials.

The first shield 232 has a length, width, and height. The length of the first shield 232 may be measured on the X-axis. The width of the first shield 232 may be measured on the Y-axis (i.e., coming out of the page). The height of the first shield 232 may be measured on the Z axis (i.e., measured vertically). For example, the height of the first shield 232 may be measured by the height of the first shield sidewalls (e.g., measured from the bottom of the substrate 202 to the first shield top side 232a). The length, width, and height of the first shield 232 may be determined by those of skill in the art. For example, the length, width, and height of the first shield 232 may be large enough to cover the electronic components 210 and 212 and/or may be large enough to cover the substrate 202.

The first shield 232 has a thickness. Thickness may be defined as the depth of the first shield 232. For example, the first shield top side 232a has a thickness, and each of the first first shield sidewall 232b, second first shield sidewall 232c, third first shield sidewall (not shown), and fourth first shield sidewall (not shown) (i.e., collectively first shield sidewalls) have a thickness that may be the same or different. In order to keep the form factor of the IC package 200 small, the thickness of the first shield 232 may be kept small. In one aspect, the thickness of the first shield 232 may be in the range of about 1 μm-30 μm. In another aspect, the thickness of the first shield 232 may be about equal to the thickness of the second shield 240 (e.g., the thickness of the first shield 232 and the thickness of the second shield 240 may have a 1:1 ratio). In another aspect, the thickness of the first shield 232 may be thicker than the second shield 240.

The second shield 240 is located over the first shield 232. The second shield 240 has a second shield top side 240a, and a first second shield sidewall 240b, a second second shield sidewall 240c, a third second shield sidewall (not shown in this view), and a fourth first shield sidewall (not shown in this view) (i.e., collectively first shield sidewalls). The second shield 240 may enclose the first shield 232, the molded electronic components 210 and 212, and the substrate 202.

In one aspect, the second shield 240 may be coupled directly or indirectly (e.g., with an intervening material) to the first shield 232. The second shield 240 is located over the first shield 232 sidewalls, and over the mold 220 sidewalls so that the second shield 240 encompasses the IC package 200. Specifically, the second shield top side 240*a* is located over the first shield top side 232*a*, and the second shield sidewalls (e.g., 240*a*, 240*b*, etc.,) are located over the first shield sidewalls (e.g., 232*a*, 232*b*, etc.,) and the substrate 202 sidewalls. That is, the second shield 240 is located over the substrate 202 sidewalls and is coupled to ground via the substrate 202 (i.e., through the substrate 202 ground connection).

The second shield 240 is a high permeability shield. The material of the second shield 240 may be made of a high permeability metal. Permeability refers to a material's ability to attract and conduct magnetic lines of flux. The more conductive a material is to magnetic fields, the higher its permeability. In one aspect, the material may have a permeability larger than 10 H/m. The second shield 240 may include ferromagnetic material. The second shield 240 may include any of the following materials or a combination of one or more of the following materials, or an alloy thereof: Ferromagnetic material, ferromagnetic alloy, Iron (Fe), Nickel (Ni), or Manganese (Mn), however it is not so limited. The second shield 240 may include copper as part of a ferromagnetic alloy.

The second shield 240 has a length, width, and height. The length of the second shield 240 may be measured on the X-axis. The width of the second shield 240 may be measured on the Y-axis (i.e., coming out of the page). The length and width of the second shield 240 may be determined by those of skill in the art. For example, the length and width of the second shield 240 may be large enough to cover the electronic components 210 and 212 or may be large enough to cover the substrate 202, as well as cover the first shield 232. The height of the second shield 240 may be measured on the Z axis (i.e., measured vertically). The height of the second shield 240 may be measured as the distance from the bottom of the substrate 202 to the second shield top side 240*a*.

The second shield 240 has a thickness. Thickness may be defined as the depth of the second shield 240. For example, the second shield top side 240*a* has a thickness, and each of the first second shield sidewall 240*b*, second second shield sidewall 240*c*, third second shield sidewall (not shown), and fourth second shield sidewall (not shown) (i.e., collectively second shield sidewalls 240) have a thickness that may be the same or different. In order to keep the form factor of the IC package 200 small, the thickness of the second shield 240 may be kept small. In one aspect, the thickness of the second shield 240 may be in the range of about 100 nm to 300 µm. In another aspect, the thickness of the second shield 240 may be about 100 µm. In another aspect, the thickness of the second shield 240 may be equal to the thickness of the second shield 240 (e.g., in a 1:1 ratio). In another aspect, the thickness of the second shield 240 may be less than the thickness of the first shield 232.

In one aspect, together, the first shield 232 and the second shield 240 may have a total shield thickness of about 1.1 µm to 330 µm.

Figure 3:
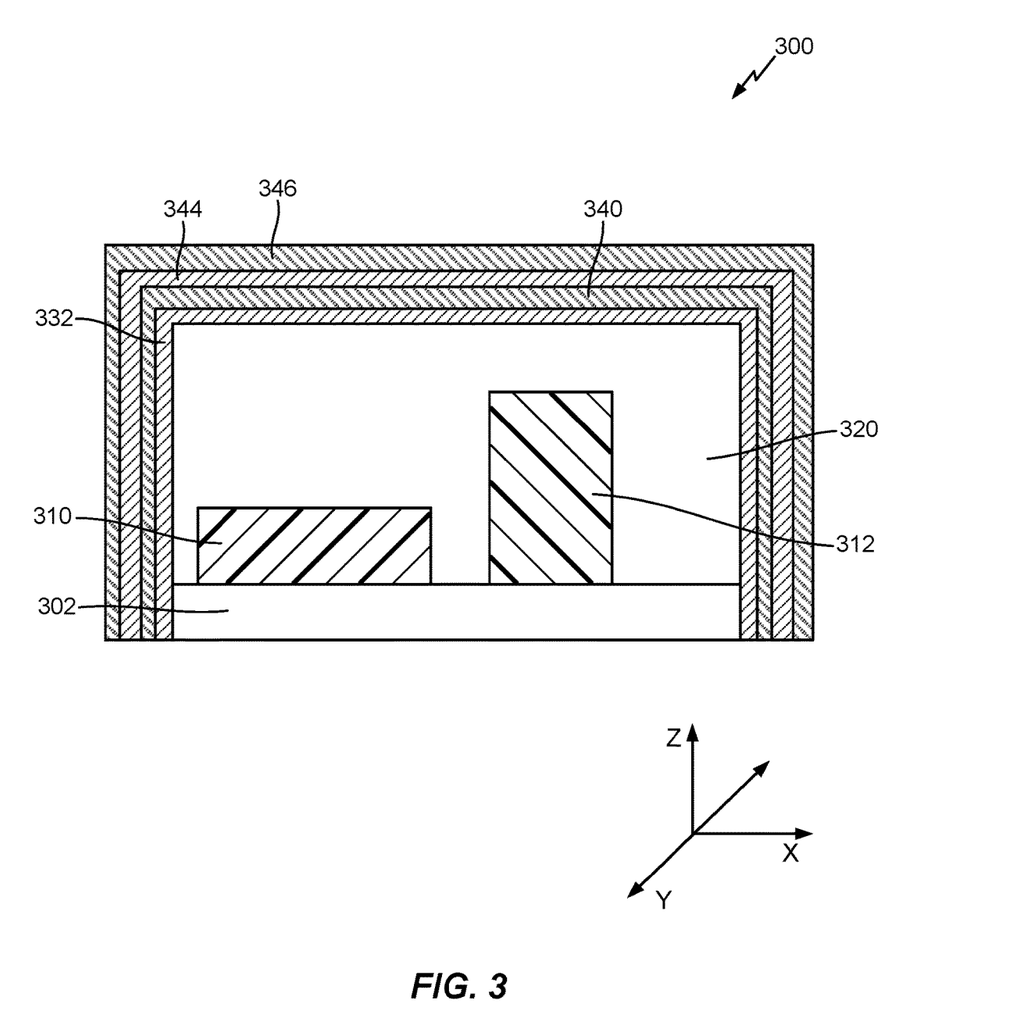
FIG. 3 illustrates a side view of an integrated circuit package including an enhanced electromagnetic shield.

FIG. 3 illustrates a side view of an integrated circuit package including an enhanced electromagnetic shield. FIG. 3 is like FIG. 2, except that IC package 300 includes a third shield 344 located over the second shield 340, and includes a fourth shield 346 located over the third shield 344. The third shield 344 is a high conductivity shield and the fourth shield 346 is a high permeability shield. The IC package 300 also includes a substrate 302 (e.g., a package substrate), a mold 320 that partially surrounds an electronic component such as 310, and 312.

The mold 320 includes mold sidewalls, the first shield 332 includes first shield sidewalls, the second shield 340 includes second shield sidewalls, the third shield 344 includes third shield sidewalls, the fourth shield 346 includes fourth shield sidewalls, and the substrate 302 includes substrate sidewalls. Similar to FIG. 2, the fourth shield 346 is located over the top of the third shield 344 and over the third shield sidewalls. The third shield 344 is located over the top of the second shield 340 and over the second shield sidewalls. The second shield 340 is located over the top of the first shield 332 and over the first shield sidewalls. The first shield 332 is located over the top of the mold 320, over the mold sidewalls, and over the substrate sidewalls.

It shall be understood, that although FIG. 3 illustrates a total of four shields (i.e., a first shield 332, a second shield 340, a third shield 344, and a fourth shield 346), IC package 300 is not so limited. In one aspect, the fourth shield 346 is not included, therefore the third shield 344 would be the outer most shield.

In another aspect, there are more than four shields. The arrangement of the first shield 332 (i.e., high conductivity shield) over the second shield 340 (i.e., high permeability shield) may alternated repeatedly. For example, a fifth shield (not shown) may be located over the fourth shield 346, where the fifth shield is a high conductivity shield. Optionally, a sixth shield (not shown) may be located over the fifth shield (not shown). The sixth shield may be a high permeability shield.

Figure 4:
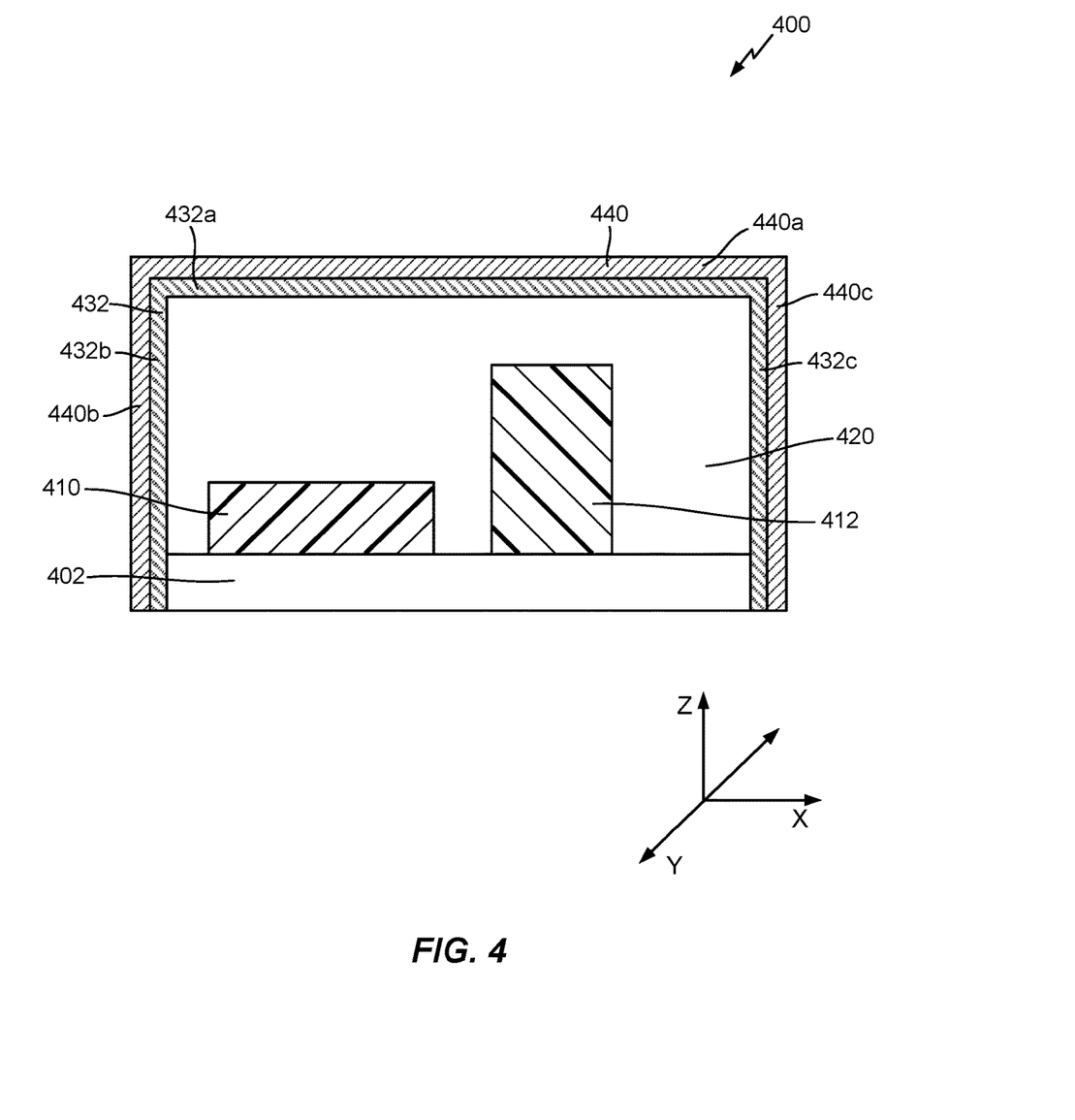
FIG. 4 illustrates a side view of an integrated circuit package including an enhanced electromagnetic shield.

FIG. 4 illustrates a side view of an integrated circuit package including an enhanced electromagnetic shield. Specifically, FIG. 4 illustrates an integrated circuit (IC) package 400. The IC package 400 includes a substrate 402, electronic components 410 and 412, a mold 420, a first shield 432, and a second shield 440. The first shield is a high permeability shield 432, and the second shield 440 is a high conductivity shield. It shall be understood that FIG. 4 is a simplified drawing of the IC package 400. The IC package 400 may include additional elements not shown such as dielectric layers, passivation layers, metal layers, and electronic components embedded in the substrate 402 or in a silicon substrate of one of the electronic components 410.

The substrate 402 may be a package substrate. Alternatively, at least one of the electronic components 410 or 412 and the substrate 402 together may comprise a wafer level package. The substrate 402 includes substrate sidewalls. The substrate 402 may be coupled to ground.

The electronic component 410 may be an IC, a die, a passive device or any other type of electronic component. The electronic component 412 may be an IC, a die, a passive device or any other type of electronic component. The IC package 400 may only have a single electronic component (e.g., one of 410 or 412) or may have many electronic components.

The mold 420 partially surrounds the electronic components 410 and/or 412 and is coupled to the substrate 402. The mold 420 has a top side, and a first mold sidewall, a second mold sidewall, a third mold sidewall, and a fourth mold sidewall (i.e., collectively mold sidewalls). The mold 420 may include one or more of the following materials: Epoxy resin with fused silica filler or any other organic filler material, but is not so limited. For example, the mold 420 may be any material that can be deposited, formed or molded over the electronic components 410 and/or 412 and that provides mechanical support, and environmental protection for the IC package 400 and the electronic components 410 and/or 412.

The first shield 432 is located over the mold 420, and in one aspect, may be coupled directly to the mold 420. The first shield 432 has a first shield top side 432*a*, and a first first shield sidewall 432*b*, a second first shield sidewall 432*c*, a third first shield sidewall (not shown in this view), and a fourth first shield sidewall (not shown in this view) (i.e., collectively first shield sidewalls). In one aspect, the first shield 432 is located over the top side of the mold 360 and over the mold 360 sidewalls. In another aspect, the first shield 432 is located directly on the top side of the mold 360, and directly on the mold 360 sidewalls. In either of the above-mentioned aspects, the first shield 432 is over the substrate sidewalls.

The first shield 432 is a high permeability shield. The material of the first shield 432 may be made of a high permeability metal. Permeability refers to a material's ability to attract and conduct magnetic lines of flux. The more conductive a material is to magnetic fields, the higher its permeability. In one aspect, the material may have a permeability larger than 10 H/m. The first shield 432 may include ferromagnetic material. The first shield 432 may include any of the following materials or a combination of one or more of the following materials, or an alloy thereof: Ferromagnetic material, Iron (Fe), Nickel (Ni), or Manganese (Mn), however it is not so limited. The first shield 432 may include copper as part of a ferromagnetic alloy.

The first shield 432 has a length, width, and height. The length of the first shield 432 may be measured on the X-axis. The width of the first shield 432 may be measured on the Y-axis (i.e., coming out of the page). The length and width of the first shield 432 may be determined by those of skill in the art. For example, the length and width of the first shield 432 may be large enough to cover the electronic components 410 and 412 or may be large enough to cover the substrate 402, as well as cover the first shield 432. The height of the first shield 432 may be measured on the Z axis (i.e., measured vertically). The height of the first shield 432 may be measured as the distance from the bottom of the substrate 402 to the first shield top side 432*a*.

The first shield 432 has a thickness. Thickness may be defined as the depth of the first shield 432. For example, the first shield top side 432*a* has a thickness, and each of the first first shield sidewall 432*b*, second first shield sidewall 432*c*, third first shield sidewall (not shown), and fourth first shield sidewall (not shown) (i.e., collectively first shield sidewalls 432) have a thickness that may be the same or different. In order to keep the form factor of the IC package 400 small, the thickness of the first shield 432 may be kept small. In one aspect, the thickness of the first shield 432 may be in the range of about 100 nm to 300 μm. In another aspect, the thickness of the first shield 432 may be about 100 μm. In another aspect, the thickness of the first shield 432 may be equal to the thickness of the first shield 432 (e.g., in a 1:1 ratio). In another aspect, the thickness of the first shield 432 may be less than the thickness of the first shield 432.

The second shield 440 is located over the first shield 432. The second shield 440 has a second shield top side 440*a*, and a first second shield sidewall 440*b*, a second second shield sidewall 440*c*, a third second shield sidewall (not shown in this view), and a fourth first shield sidewall (not shown in this view) (i.e., collectively first shield sidewalls). The second shield 440 may enclose the first shield 432, the molded electronic components 410 and 412, and the substrate 402.

In one aspect, the second shield 440 may be coupled directly or indirectly (e.g., with an intervening material) to the first shield 432. The second shield 440 is located over the first shield 432 sidewalls, and over the mold 420 sidewalls so that the second shield 440 encompasses the IC package 400. Specifically, the second shield top side 440*a* is located over the first shield top side 432*a*, and the second shield sidewalls (e.g., 440*a*, 440*b*, etc.,) are located over the first shield sidewalls (e.g., 432*a*, 432*b*, etc.,) and the substrate 402 sidewalls. That is, the second shield 440 is located over the substrate 402 sidewalls and is coupled to ground via the substrate 402 (i.e., through the substrate 402 ground connection).

The second shield 440 is a high conductivity shield. The material of the second shield 440 may be made of a high conductivity metal. Conductivity refers to the amount, level, or extent to which a specified material conducts electricity. The more a material can conduct electricity, the higher its conductivity. The second shield 440 is a high conductivity shield relative to the first shield 432. In other words, the first shield 432 has a higher conductivity than the second shield 440. In one aspect, the second shield 440 is ten times more conductive than the first shield 332, In another aspect, the second shield 440 is a high conductivity shield, because it has a conductivity greater than $1 \times 10^6$ S/m.

The second shield 440 includes at least one of the following materials: copper (Cu), silver (Ag), gold (Au), aluminum (Al), or an alloy of any one of said materials, or any combination of said materials.

The second shield 440 has a length, width, and height. The length of the second shield 440 may be measured on the X-axis. The width of the second shield 440 may be measured on the Y-axis (i.e., coming out of the page). The height of the second shield 440 may be measured on the Z axis (i.e., measured vertically). The height of the second shield 440 may be measured as the distance from the bottom of the substrate 402 to the second shield top side 440*b*. The length, width, and height of the second shield 440 may be determined by those of skill in the art. For example, the length, width, and height of the second shield 440 may be large enough to cover the electronic components 410 and 412 and/or may be large enough to cover the substrate 402.

The second shield 440 has a thickness. Thickness may be defined as the depth of the second shield 440. For example, the second shield top side 440*a* has a thickness, and each of the first second shield sidewall 432*b*, second second shield sidewall 432*c*, third second shield sidewall (not shown), and fourth second shield sidewall (not shown) (i.e., collectively second shield sidewalls) have a thickness that may be the same or different from each other. In order to keep the form factor of the IC package 400 small, the thickness of the second shield 440 may be kept small. In one aspect, the thickness of the second shield 440 may be in the range of about 1 μm-30 μm. In another aspect, the thickness of the second shield 440 may be about equal to the thickness of the second shield 440 (e.g., the thickness of the second shield 440 and the thickness of the second shield 440 may have a 1:1 ratio). In another aspect, the thickness of the second shield 440 may be thicker than the second shield 440.

In one aspect, together, the first shield 432 and the second shield 440 may have a total shield thickness of about 1.1 μm to 330 μm.

Figure 5:
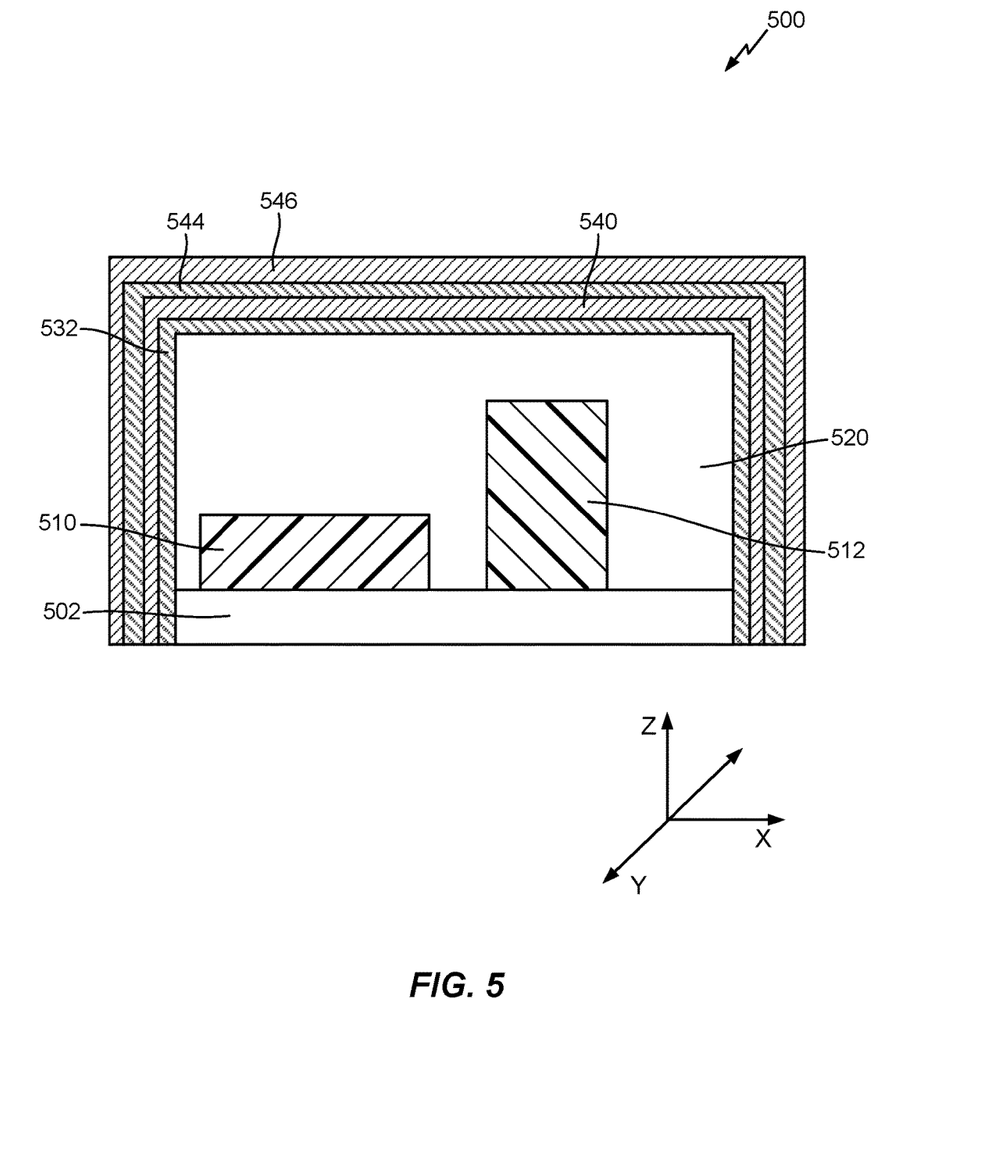
FIG. 5 illustrates a side view of an integrated circuit package including an enhanced electromagnetic shield.

FIG. 5 illustrates a side view of an integrated circuit package including an enhanced electromagnetic shield. FIG. 5 is like FIG. 4, except that IC package 500 includes a third shield 544 located over the second shield 540, and includes a fourth shield 546 located over the third shield 544. The third shield 544 is a high permeability shield and the fourth shield 546 is a high conductivity shield. The IC package 500 also includes a substrate 502 (e.g., a package substrate), a mold 520 that partially surrounds an electronic component such as 510, and 512.

The mold 520 includes mold sidewalls, the first shield 532 includes first shield sidewalls, the second shield 540 includes second shield sidewalls, the third shield 544 includes third shield sidewalls, the fourth shield 546 includes fourth shield sidewalls, and the substrate 502 includes substrate sidewalls. Similar to FIG. 4, the fourth shield 546 is located over the top of the third shield 544 and over the third shield sidewalls. The third shield 544 is located over the top of the second shield 540 and over the second shield sidewalls. The second shield 540 is located over the top of the first shield 532 and over the first shield sidewalls. The first shield 532 is located over the top of the mold 520, over the mold sidewalls, and over the substrate sidewalls.

It shall be understood, that although FIG. 5 illustrates a total of four shields (i.e., first shield 532, second shield 540, third shield 544, and fourth shield 546), IC package 500 is not so limited. In one aspect, the fourth shield 546 is not included, therefore the third shield 544 would be the outer most shield.

In another aspect, there are more than four shields. The arrangement of the first shield 532 (i.e., high permeability shield) over the second shield 540 (i.e., high conductivity shield) may alternate repeatedly. For example, a fifth shield (not shown) may be located over the fourth shield 546, where the fifth shield is a high permeability shield. Optionally, a sixth shield (not shown) may be located over the fifth shield (not shown). The sixth shield may be a high conductivity shield.

In comparison to conventional electromagnetic conformal shielding, the disclosed integrated circuit packages 200, 300, 400, and 500 with enhanced electromagnetic shield has a high shielding effectiveness over a wide frequency range covering 1 MHz-12 GHz. For instance, the high permeability shield (e.g., 240, 340, 346, 432, 532, and 544) increases the shielding effectiveness in the lower frequency range <3 GHz, whereas the high conductivity shield (e.g. 232, 332, 344, 440, 540, and 546) contributes at higher frequencies >3 GHz.

Figure 6:
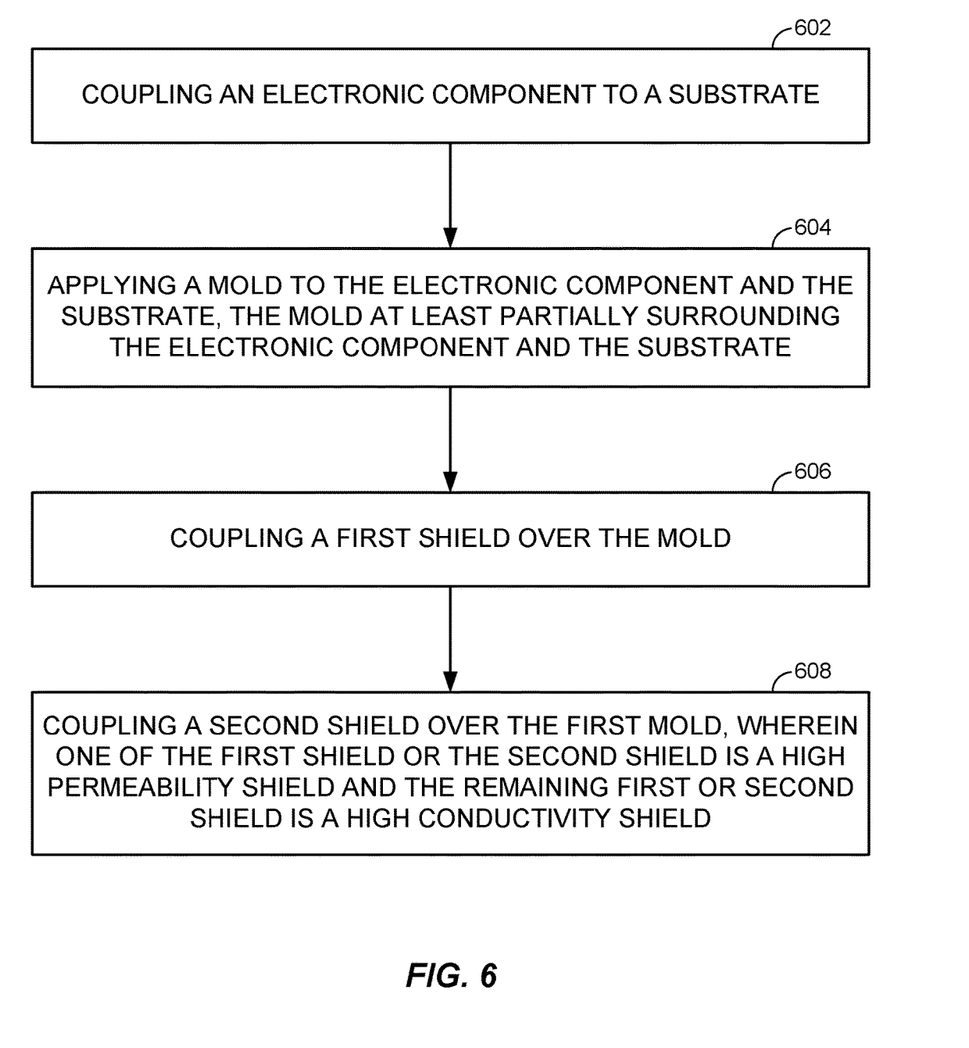
FIG. 6 illustrates an exemplary flow diagram of a method for manufacturing an integrated circuit package including an enhanced electromagnetic shield.

Exemplary Flow Diagram of a Method for Manufacturing an Integrated Circuit Package Comprising an Enhanced Electromagnetic Shield FIG. 6 illustrates an exemplary flow diagram of a method for manufacturing an integrated circuit package including an enhanced electromagnetic shield. It should be noted that for the purpose of clarity and simplification, the flow diagram of FIG. 6 does not necessarily include all the steps of manufacturing a substrate that includes one or more embedded interconnects. Moreover, in some instances, several steps may have been combined into a single step to simplify the description of the sequences.

As shown in FIG. 6, the method, at step 602, includes coupling an electronic component to a substrate. The substrate may be a package substrate. Alternatively, the electronic component and the substrate together may comprise a wafer level package. The substrate includes substrate sidewalls. The substrate may be coupled to ground.

At step 604, the method includes applying a mold to the electronic component and the substrate, the mold partially surrounding the electronic component and the substrate. The mold may include one or more of the following materials: Epoxy resin with fused silica filler or any other organic filler material, but is not so limited. For example, the mold may be any material that can be deposited, formed or molded over the electronic component and that provides mechanical support, and environmental protection for the IC package and the electronic component. Applying the mold may include applying an over-molding process, and optionally an under-mold process.

At step 606, the method includes coupling a first shield over the mold. Coupling of the third shield occurs after step 604. The first shield is coupled over the mold by any of the following methods: by plating, sputtering, or spray coating. In other words, the first shield may be a sputtered shield, a plated shield, or a spray coated shield. Compression molding may also be utilized.

At step 608, the method includes coupling a second shield over the first shield, wherein the first shield is a high permeability shield. The second shield is coupled over the first shield by any of the following methods: by plating, sputtering, or spray coating. Compression molding may also be utilized.

Exemplary Electronic Devices

Figure 7:
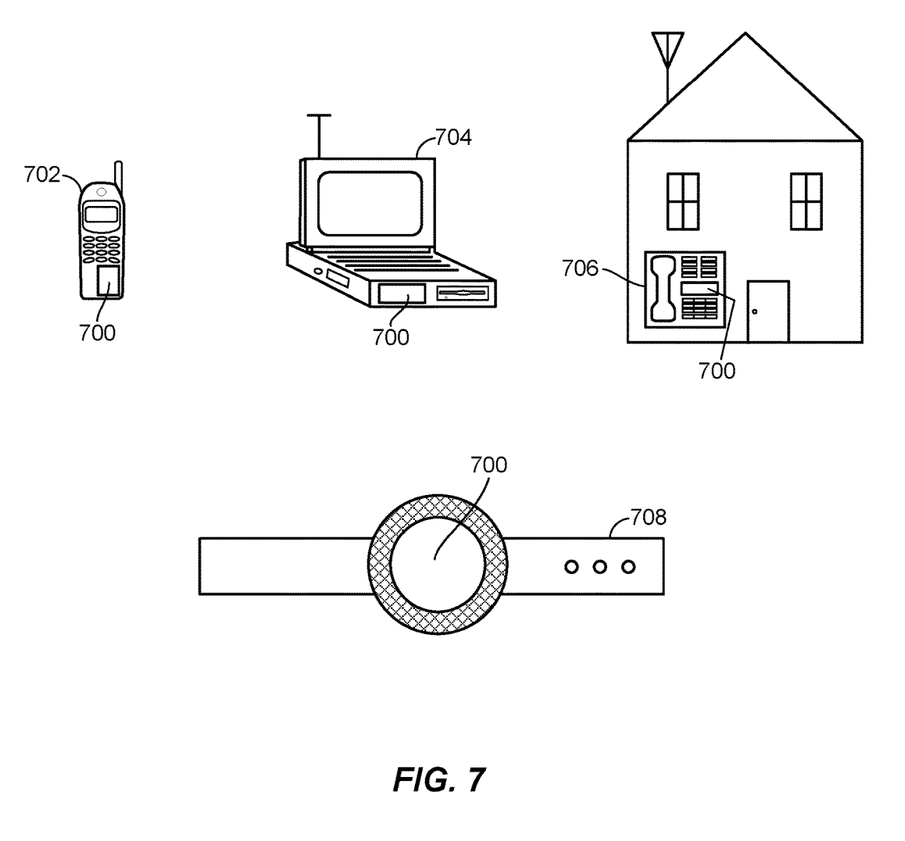
FIG. 7 illustrates various electronic devices that may include the various substrates, integrated devices, integrated device packages, semiconductor devices, dies, integrated circuits, and/or packages described herein.

FIG. 7 illustrates various electronic devices that may be integrated with any of the aforementioned integrated circuit package including an enhanced electromagnetic shield. For example, a mobile phone device 702, a laptop computer device 704, a fixed location terminal device 706, a wearable device 708 may include an integrated device 700 as described herein. The integrated device 700 may be, for example, any of the substrate, integrated circuits, dies, integrated devices, integrated device packages, integrated circuit devices, device packages, integrated circuit (IC) packages, package-on-package devices described herein. The devices 702, 704, 706, 708 illustrated in FIG. 7 are merely exemplary. Other electronic devices may also feature the integrated device 700 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watch, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIG. 2 through FIG. 6 may be rearranged and/or combined into a single component, process, feature or function or embodied in several components, processes, or functions. Additional elements, components, processes, and/or functions may also be added without departing from the disclosure. In some implementations, a device may include a die, an integrated device, a die package, an integrated circuit (IC), a device package, an integrated circuit (IC) package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "traverse" as used herein, means to go across and includes going all the way across an object or partially across an object.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package, comprising:
    a substrate;
    an electronic component coupled to the substrate;
    a mold partially surrounding the electronic component and coupled to the substrate;
    a first shield located over the mold; and
    a second shield located over the first shield, wherein one of the first shield or the second shield is a high permeability shield and the remaining first or second shield is a high conductivity shield relative to the high permeability shield, wherein both the first shield and the second shield are electromagnetic shields, and wherein a total shield thickness including the first shield and the second shield is about 1.1 μm to 330 μm.

2. The package of claim 1, wherein the high permeability shield has a permeability larger than 10 H/m.

3. The package of claim 2, wherein the high permeability shield includes at least one material selected from the group consisting of ferromagnetic material, iron, nickel, and manganese, or a combination thereof.

4. The package of claim 1, wherein the high conductivity shield is ten times more conductive than the high permeability shield.

5. The package of claim 4, wherein the high conductivity shield includes at least one material selected from the group consisting of copper, silver, gold, and aluminum, or a combination thereof.

6. The package of claim 1, further comprising mold sidewalls, first shield sidewalls and substrate sidewalls, wherein the second shield is located over the mold sidewalls, the first shield sidewalls, and the substrate sidewalls.

7. The package of claim 6, wherein the first shield sidewalls are located over the mold sidewalls and over the substrate sidewalls.

8. The package of claim 1, wherein the high permeability shield is configured to have a thickness of about 100 nm to 300 μm.

9. The package of claim 8, wherein the high conductivity shield is configured to have a thickness of about 1 μm to 30 μm.

10. The package of claim 1, wherein a thickness of the high permeability shield and a thickness of the high conductivity shield has a 1:1 ratio.

11. The package of claim 1, wherein the first or second shield is a sputtered shield, a plated shield, or a spray coated shield.

12. The package of claim 1, wherein the high conductivity shield includes at least one material selected from the group consisting of copper, silver, gold, aluminum, and an alloy thereof.

13. The package of claim 1, wherein the first shield and the second shield alternate repeatedly to form more than two shields.

14. The package of claim 13, further comprising:
    a third shield located over the second shield and the third shield, wherein the third shield is a high permeability shield if the first shield is a high permeability shield, or a high conductivity shield if the first shield is a high conductivity shield.

15. The package of claim 14, further comprising:
    a fourth shield located over the second shield and the third shield, wherein the fourth shield is a high permeability shield if the second shield is a high permeability shield, or a high conductivity shield if the second shield is a high conductivity shield.

16. The package of claim 1, wherein the package is incorporated into a device selected from a group consisting of a music player, a video player, an entertainment unit, a navigation device, a communications device, a mobile device, a mobile phone, a smart phone, a personal digital assistant, a fixed location terminal or server, a tablet computer, and a laptop computer, and further including the device.

* * * * *